(12) United States Patent
Chen et al.

(10) Patent No.: US 11,271,365 B2
(45) Date of Patent: Mar. 8, 2022

(54) LASER ELEMENT

(71) Applicant: iReach Corporation, Hsinchu (TW)

(72) Inventors: Shou-Lung Chen, Hsinchu (TW); Hsin-Chan Chung, Hsinchu (TW)

(73) Assignee: iReach Corporation, Hsinchu (TW)

(*) Notice: Subject to any disclaimer, the term of this patent is extended or adjusted under 35 U.S.C. 154(b) by 60 days.

(21) Appl. No.: 16/678,805

(22) Filed: Nov. 8, 2019

(65) Prior Publication Data

US 2020/0153197 A1 May 14, 2020

(30) Foreign Application Priority Data

Nov. 8, 2018 (TW) .................. 107139739

(51) Int. Cl.
| | |
|---|---|
| *H01S 5/042* | (2006.01) |
| *H01S 5/028* | (2006.01) |
| *H01S 5/02* | (2006.01) |
| *H01S 5/183* | (2006.01) |
| *H01S 5/0234* | (2021.01) |

(52) U.S. Cl.
CPC .......... *H01S 5/0281* (2013.01); *H01S 5/0216* (2013.01); *H01S 5/0282* (2013.01); *H01S 5/0425* (2013.01); *H01S 5/04254* (2019.08); *H01S 5/04257* (2019.08); *H01S 5/183* (2013.01); *H01S 5/0201* (2013.01); *H01S 5/0234* (2021.01)

(58) Field of Classification Search
CPC .. H01S 5/04257; H01S 5/0234; H01S 5/0216; H01S 5/0014; H01S 5/0021; H01S 5/06825
See application file for complete search history.

(56) References Cited

U.S. PATENT DOCUMENTS

| | | | |
|---|---|---|---|
| 2005/0169569 A1* | 8/2005 | Liu | H01L 31/0203 385/14 |
| 2017/0353004 A1* | 12/2017 | Chen | H01S 5/02253 |
| 2020/0127441 A1* | 4/2020 | Ghosh | H01S 5/141 |

* cited by examiner

*Primary Examiner* — Tod T Van Roy
(74) *Attorney, Agent, or Firm* — Ditthavong, Steiner & Mlotkowski

(57) ABSTRACT

A laser element includes a transparent substrate, a conductive layer on the transparent substrate, an adhesive layer, attached to the transparent substrate and having a first side surface, a laser unit, wherein the laser unit comprises a front conductive structure, attached to the adhesive layer and having a second side surface, a back conductive structure, which comprises a first detecting electrode and a second detecting electrode separated from the first detecting electrode, a passivation layer covering one of the first side surface and the second side surface, and first via holes extending from the back conductive structure to the conductive layer, wherein the first detecting electrode and the second detecting electrode are electrically connected to the conductive layer through the first via holes.

20 Claims, 12 Drawing Sheets

LASER ELEMENT

BACKGROUND

Technical Field

The present application relates to a laser element, and particularly to a laser element integrating with a monitoring circuit.

RELATED APPLICATION DATA

This application claims the right of priority of TW Application No. 107139739, filed on Nov. 8, 2018, and the content of which is hereby incorporated by reference in its entirety.

Related Art

The statements herein merely provide background information related to the present application and do not necessarily constitute the prior art.

A laser module is an assembly of a laser element, such as vertical cavity surface emitting lasers (VCSELs), with a corresponding optical element as a laser source. However, when in use, if the laser module is subjected to an external force like collision or falls, the optical element may be ruptured and laser light emitted by the laser element is leaked from the rupture without any optical processing, which may be directly irradiated to human eyes.

SUMMARY

In view of this, some embodiments of the present application provide a laser element and a manufacturing method thereof.

A laser element includes a transparent substrate, a conductive layer on the transparent substrate, an adhesive layer, attached to the transparent substrate, a laser unit, wherein the laser unit comprises a front conductive structure, attached to the adhesive layer, a back conductive structure opposite to the front conductive structure, which comprises a plurality of detecting electrodes separated from each other, and a via hole extending from the back conductive structure to the conductive layer, wherein the plurality of detecting electrodes electrically connected to the conductive layer through the via hole A laser element comprises a transparent substrate, an adhesive layer, attached to the transparent substrate, a conductive region, disposed on a periphery of the adhesive layer, and a laser unit, which comprises a front conductive structure, attached to the adhesive layer, a back conductive structure opposite to the front conductive structure, wherein the back conductive structure comprises a plurality of detecting electrodes separated from each other, and a via hole extending from the back conductive structure and penetrating through the front conductive structure, wherein two ends of the channel are respectively connected to the plurality of detecting electrodes and the conductive region, and the conductive region surrounds the laser unit and is electrically separated therefrom.

The purposes, technical contents, features, and effects of the present invention will be more readily understood by the following specific embodiments in conjunction with the accompanying drawings.

DETAILED DESCRIPTION

Figure 1:
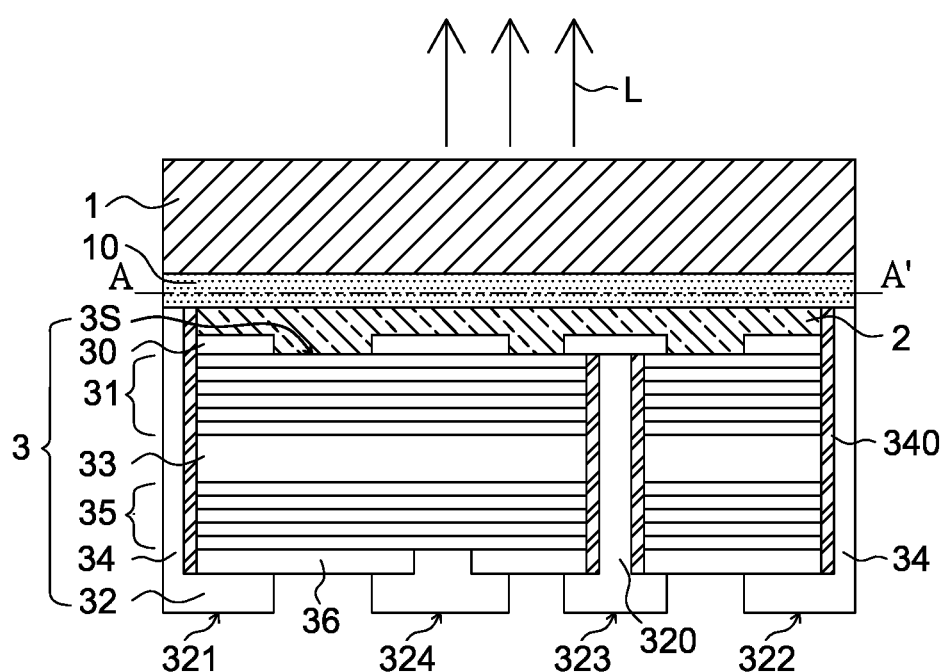
FIG. 1 is a schematic view of a laser element according to an embodiment of the present application.

The various embodiments of the present application will be described in detail below with reference to the drawings as examples. In the description of the specification, a number of specific details are provided for a reader to more completely understand the present invention. However, the present invention may be implemented based on the premise of omitting some or all of the specific details. The same or similar elements in the drawings will be denoted by the same or similar symbols. It is to be specially noted that the drawings are for illustrative purposes only and do not represent the actual dimensions or quantities of the elements. Some of the details may not be fully drawn in order to facilitate the simplicity of the drawings.

Referring to FIG. 1, a laser element according to an embodiment of the present application includes a transparent substrate 1, an adhesive layer 2, a laser unit 3, a plurality of first channels 34, and a conductive layer 10 on the transparent substrate 1. For example, the transparent substrate 1 includes sapphire, glass, or silicon carbide (SiC). In some embodiments, the transparent substrate 1 is an optical element, and may be patterned to produce a specific optical effect. The conductive layer 10 includes a transparent conductive oxide or a metal. The transparent conductive oxide may be indium tin oxide (ITO) or indium zinc oxide (IZO). In the present embodiment, the conductive layer 10 is disposed between the transparent substrate 1 and the adhesive layer 2.

One side of the adhesive layer 2 is attached to the conductive layer 10, and the other side thereof is attached to a light exiting side 3S of the laser unit 3. For example, the adhesive layer 2 can be benzocyclobutene (BCB), silicon dioxide or a transparent conductive oxide.

The laser unit 3 includes a front conductive structure 30, a first type semiconductor stack 31, an active layer 33, a second type semiconductor stack 35, an insulating layer 36, and a back conductive structure 32. The back conductive structure 32 includes a first conductive electrode 323 and a second conductive electrode 324 which are separated from each other. The first type semiconductor and the second type semiconductor herein respectively refer to semiconductors with different electrical properties. If a semiconductor uses holes as a majority carrier, it is a p-type semiconductor, and if the semiconductor uses electrons as a majority carrier, it is an n-type semiconductor. For example, the first type semiconductor stack 31 is an n-type semiconductor stack, and the second type semiconductor stack 35 is a p-type semiconductor stack, and vice versa. The active layer 33 is between the first type semiconductor stack 31 and the second type semiconductor stack 32, and includes a p-n junction to generate a depletion region for holes and electrons recombining to emit light. In some embodiments, the active layer 33 is formed of multiple quantum wells, which has better luminous efficiency than the p-n junction. In an embodiment, the materials of the first type semiconductor stack 31, the second type semiconductor stack 35, and the active layer 33 include a III-V compound semiconductor, for example, GaAs, InGaAs, AlGaAs, AlInGaAs, GaP, InGaP, AlInP, AlGaInP, GaN, InGaN, AlGaN, AlInGaN, AlAsSb, InGaAsP, InGaAsN, AlGaAsP, and the like. In the embodiments of the present disclosure, unless otherwise specified, the above chemical expressions include "stoichiometric compounds" and "non-stoichiometric compounds". The "stoichiometric compound" has a total element measurement of the group III element the same as a total element measurement of the group V element, whereas the "non-stoichiometric compounds" has a total element measurement of the group III element different from as a total element measurement of the group V element. For example, the chemical expression AlGaAs means that it includes the group III element aluminum (Al) and/or gallium (Ga) and includes the group V element arsenic (As). The total element measurement of the group III element (aluminum and/or gallium) may be the same as or different from the total element measurement of the group V element (arsenic). In addition, if the above compounds represented by the chemical expressions are stoichiometric compounds, AlGaAs series represents $Al_{x1}Ga_{(1-x1)}As$, where $0 \leq x1 \leq 1$; AlInP represents $Al_{x2}In_{(1-x2)}P$, where $0 \leq x2 \leq 1$; AlGaInP represents $(Al_{y1}Ga_{(1-y1)})_{1-x3}In_{x3}P$, where $0 \leq x3 \leq 1$, and $0 \leq y1 \leq 1$; AlGaN series represents $Al_{x4}Ga_{(1-x4)}N$, where $0 \leq x4 \leq 1$; AlAsSb series represents $AlAs_{x5}Sb_{(1-x5)}$, where $0 \leq x5 \leq 1$; InGaP series represents $In_{x6}Ga_{1-x6}P$, where $0 \leq x6 \leq 1$; InGaAsP series represents $In_xGa_{1-x6}As_{1-y2}P_{y2}$, where $0 \leq x6 \leq 1$, and $0 \leq y2 \leq 1$; InGaAsN series represents $In_xGa_{1-x8}As_{1-y3}N_{y3}$, where $0 \leq x8 \leq 1$, and $0 \leq y3 \leq 1$; AlGaAsP series represents $Al_{x9}Ga_{1-x9}As_{1-y4}P_{y4}$, where $0 \leq x9 \leq 1$, and $0 \leq y4 \leq 1$; and InGaAs series represents $In_{x10}Ga_{1-x10}As$, where $0 \leq x10 \leq 1$. According to the material of the active layer 33, when the material of the semiconductor stacks 31, 35 is AlGaAs series, the active layer 33 may emit infrared light having a peak wavelength between 700 nm and 1700 nm. When the material of the semiconductor stacks 31, 35 is AlGaInP series, the active layer 33 may emit infrared red light having a peak wavelength between 610 nm and 700 nm, or yellow light having a peak wavelength between 530 nm and 570 nm. When the material of the semiconductor stacks 31, 35 is InGaN series, the active layer 33 may emit blue light or deep blue light having a peak wavelength between 400 nm and 490 nm, or green light having a peak wavelength between 490 nm and 550 nm. When the material of the semiconductor stacks 31, 35 is AlGaN series, the active layer 33 may emit ultraviolet light having a peak wavelength between 250 nm and 400 nm.

In the present embodiment, the first type semiconductor stack 31 and the second type semiconductor stack 35 include a plurality of overlapping layer structures to form a distributed Bragg reflector (DBR), so that a light emitted from the active layer 33 can be reflected between two distributed Bragg reflectors to form coherent light, and then the coherent light is emitted from the first type semiconductor stack 31 to form a laser light L.

In an embodiment, the insulating layer 36 is disposed between the back conductive structure 32 and the second type semiconductor stack 35. In an embodiment, the material of the insulating layer 36 includes silicon dioxide.

In an embodiment, a contact resistance between the back conductive structure 32 and the second type semiconductor stack 35 is lower than $10^{-4}$ $\Omega cm^2$ and an ohmic contact is formed between the back conductive structure 32 and the second type semiconductor stack 35. A formation mechanism of the ohmic contact is that a metal work function must be less than a semiconductor work function, so that electrons from the semiconductor to the metal and from the metal to the semiconductor can easily leap over this energy level, and current can be turned on in two directions. For example, the metal component of the second conductive electrode 324 of the back conductive structure 32 is mainly titanium aluminum alloy because titanium can form titanium nitride with the III-V compound (for example, aluminum gallium nitride) of the second type semiconductor stack 35, such that nitrogen atoms become an n-type doped surface on the surface and form a good ohmic contact after high temperature annealing.

In an embodiment, the first type semiconductor stack 31 is connected to the front conductive structure 30, the front conductive structure 30 is connected to the first conductive electrode 323 through a second channel 320, the second conductive electrode 324 and the first conductive electrode 323 are separated from each other to avoid a short circuit, and the second type semiconductor stack 35 is connected to the second conductive electrode 324. With the above conductive structure, the laser unit 3 receives an external driving voltage/current and generate the laser light L. The front conductive structure 30 is disposed on the light exiting side 3S of the laser unit 3 and attached to the adhesive layer 2. Therefore, the laser light L from the laser unit 3 emits to outside through the adhesive layer 2 and the transparent substrate 1.

Since the coherent light emitted by the laser element has a high energy, a corresponding optical element, such as the transparent substrate 1, is required for processing the coherent light to output the laser light L with appropriate intensity. In order to effectively monitor whether the laser element is damaged and prevent the laser light L that has not been optically processed through the transparent substrate 1 from being leaked and directly irradiated to human eyes, the laser element of the present embodiment has an eye safety monitoring circuit which can monitor abnormal damage of the light exiting side 3S of the laser unit 3 in real time. The following examples illustrate the working principle of the laser element structure of some embodiments.

In the present embodiment, in addition to the above semiconductor structure required for emitting the laser light, the laser unit 3 further includes a back conductive structure 32. The back conductive structure 32 includes a plurality of detecting electrodes 321, 322, and the back conductive structure 32 and the front conductive structure 30 are oppositely disposed on two sides of the laser unit 3. The plurality of first channels 34 extend from the back conductive structure 32 and penetrates through the front conductive structure 30 and the adhesive layer 2, and is connected to the conductive layer 10. Namely, two ends of one of the first channels 34 are connected to one of the detecting electrodes 321, 322 and the conductive layer 10 respectively. In some embodiments, the back conductive structure 32 includes a plurality of detecting electrodes 321, 322 and a plurality of first and second conductive electrodes 323, 324 which are separated from each other and coplanar with each other, as shown in FIG. 1. Thus, the laser element is adapted to flip chip packaging with no need for a wire bonding process, thereby saving the package volume. In another embodiment, the back conductive structure 32 includes a plurality of detecting electrodes 321, 322 extending from the back conductive structure and penetrating through the front conductive structure and the adhesive layer, and connected to the conductive layer 10.

Figure 2:
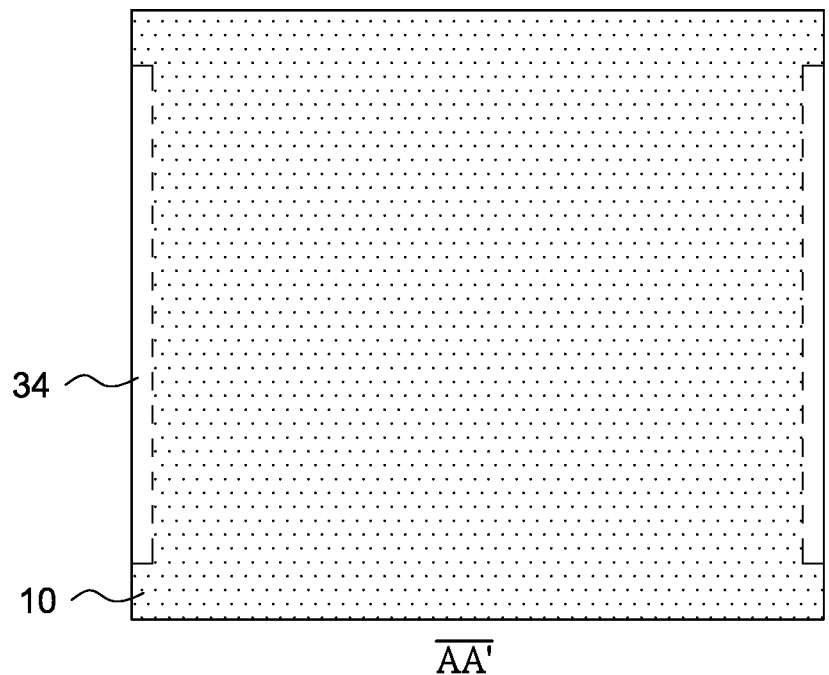
FIG. 2 is a schematic top view of the laser element taken along AA' according to an embodiment of the present application.

Referring to FIG. 1 and FIG. 2 together, FIG. 2 is a schematic top view of FIG. 1 taken along AA' as viewed from the top. The plurality of detecting electrodes 321, 322 separated from each other are electrically connected to the two ends of the conductive layer 10 through the first channels 34. Therefore, the plurality of detecting electrodes 321, 322 is externally connected to a control circuit, so that the change in a resistance value of the conductive layer 10 can be monitored in real time. When the laser element is damaged by an external impact, especially when the transparent substrate 1 is damaged at the light exiting side 3S, the conductive layer 10 is also damaged, so the resistance value becomes large, even causing an open circuit. Thus, the control circuit determines whether to cut off power supply to the laser unit 3 according to the change in the resistance value of the conductive layer 10 through the monitoring circuit, so as to prevent the laser light L emitted by the laser unit 3 from being leaked via a rupture of the transparent substrate 1 and being directly irradiated to the human eyes, thereby achieving the effect of monitoring abnormal conditions in real time.

In another embodiment, in order to prevent a conductive medium (that is the first channels 34) from contacting the front conductive structure 30, the first type semiconductor stack 31 or the second type semiconductor stack 35 of the laser unit 3 to form a short circuit, the laser unit 3 further includes a passivation layer 340 disposed on an inner wall of the first channels 34 to prevent the measured resistance value of the first channels 34 from electrical interference of the laser unit 3 and to reduce the noise during measurement.

It can be seen from the above description that the laser element according to some embodiments of the present application includes the monitoring circuit composed of the conductive layer, the first channels, and the detecting electrodes, and the laser element with the built-in monitoring circuit is produced through wafer-level semiconductor manufacturing process, thereby saving the package volume at module stage, simplifying a modularization process, and reducing the production cost.

Figure 3:
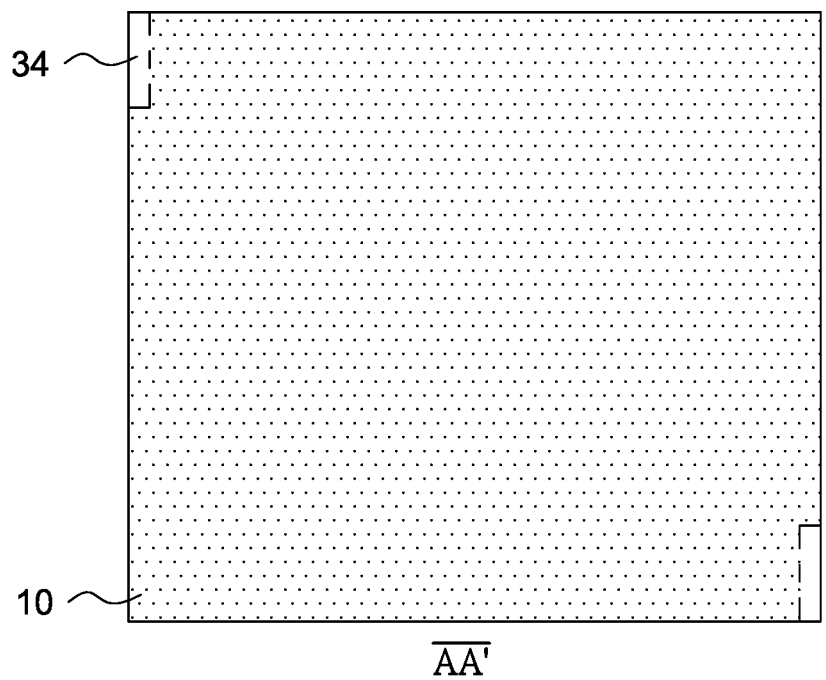
FIG. 3 is a schematic top view of the laser element taken along AA' according to an embodiment of the present application.
Figure 4:
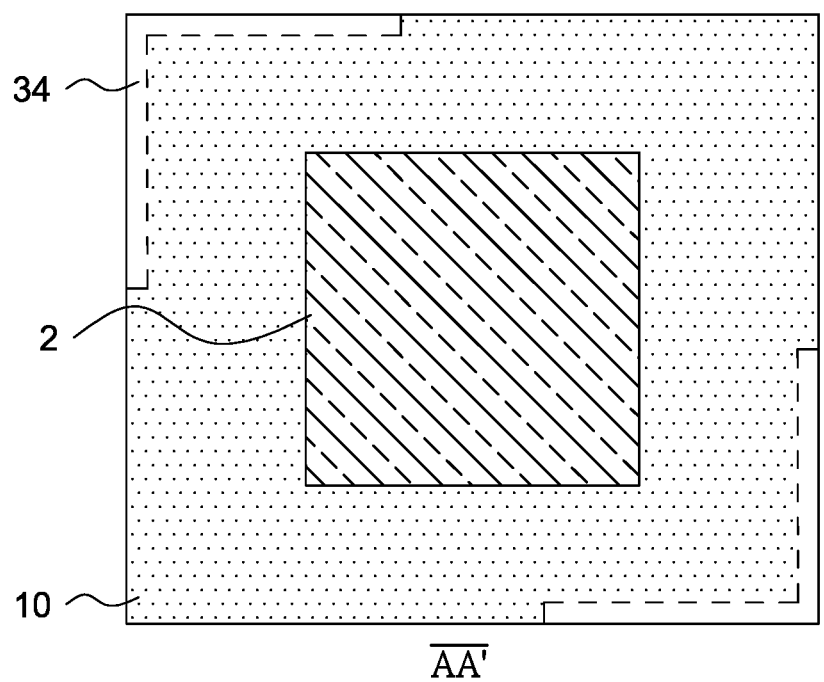
FIG. 4 is a schematic top view of the laser element taken along AA' according to an embodiment of the present application.
Figure 5A:
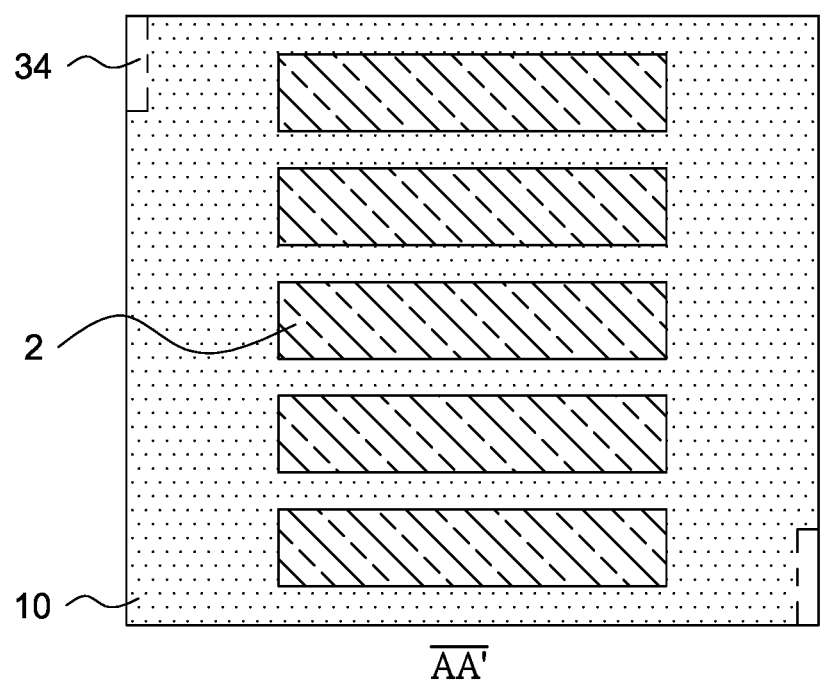
FIG. 5A is a schematic top view of the laser element taken along AA' according to an embodiment of the present application.
Figure 5B:
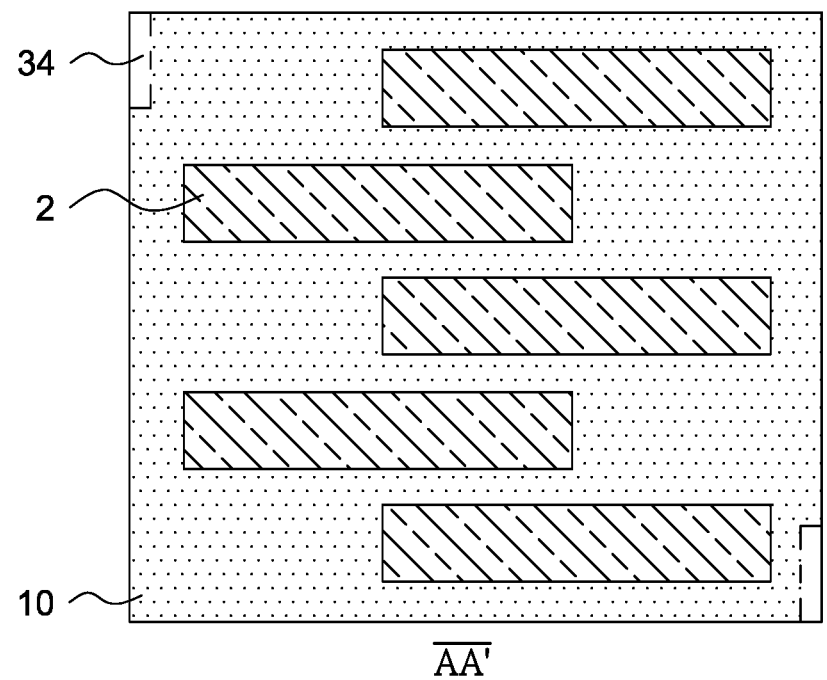
FIG. 5B is a schematic top view of the laser element taken along AA' according to an embodiment of the present application.

FIG. 3 shows the top view of the conductive layer 10 taken along line AA' shown in the cross-sectional schematic view of FIG. 1 in another embodiment. In the embodiment, in order to expand the monitoring range, the conductive layer 10 has a larger area that covers most of the transparent substrate 1. FIG. 4 shows the top view of the conductive layer 10 taken along line AA' in the cross-sectional schematic view of FIG. 1 in another embodiment. In the embodiment, the conductive layer 10 surrounds a periphery of the transparent substrate 1 and has a hollow region corresponding to a light exiting hole (not shown) on the lower side of the laser unit 3 to prevent the laser light L emitted by the laser unit 3 from being shielded by the conductive layer 10, and thus, the material of the conductive layer 10 may be an opaque material, such as a metal oxide. In some embodiments, the conductive layer 10 made of metal may have better conductivity to enhance the monitoring sensitivity without shielding the light emitted by the laser unit 3. FIG. 5A shows the top view of the conductive layer 10 taken along line AA' in the cross-sectional schematic view of FIG. 1 in another embodiment. In the embodiment, the plurality of light exiting holes of the laser unit 3 is arranged as an array, so that the conductive layer 10 form a strip-like structure for avoiding covering the plurality of light exiting holes. FIG. 5B shows the top view of the conductive layer 10 taken along line AA' in the cross-sectional schematic view of FIG. 1 in another embodiment. In the embodiment, the plurality of light exiting holes of the laser unit 3 is staggered, so that the conductive layer 10 form a snakelike geometry structure for avoiding covering the plurality of light exiting holes. Some of the above embodiments are merely illustrative of the design of a conductive layer and may also be applied to the laser element structure of other embodiments herein, but the present application is not limited thereto.

Figure 6:
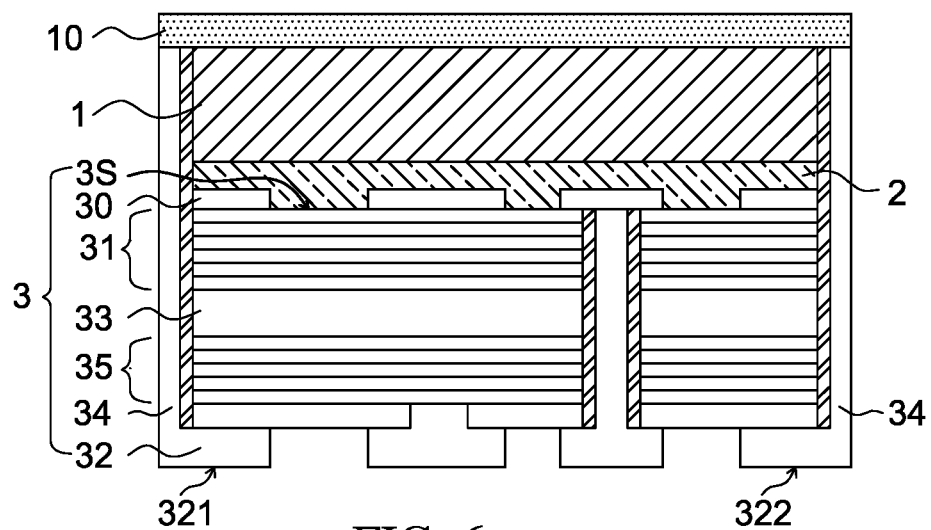
FIG. 6 is a schematic view of the laser element according to an embodiment of the present application.

Referring to FIG. 6, in an embodiment, the laser element is structurally different from the abovementioned embodiments in that the conductive layer 10 is disposed on one side of the transparent substrate 1 opposite to the adhesive layer 2. Therefore, one side of the adhesive layer 2 is attached to the transparent substrate 1, and the other side thereof is attached to the front conductive structure 30 of the laser unit 3. In order to effectively monitor the change of the resistance value of the conductive layer 10, the first channels 34 further penetrates through the adhesive layer 2 and the transparent substrate 1. Thus, the plurality of detecting electrodes 321, 322 is separated from each other are electrically connected to the two ends of the conductive layer 10 through the first channels 34 for facilitating monitoring the change of the resistance value of the conductive layer 10. The structural features and connection relationships of other components have been described as above and will not be repeated herein.

Figure 7:
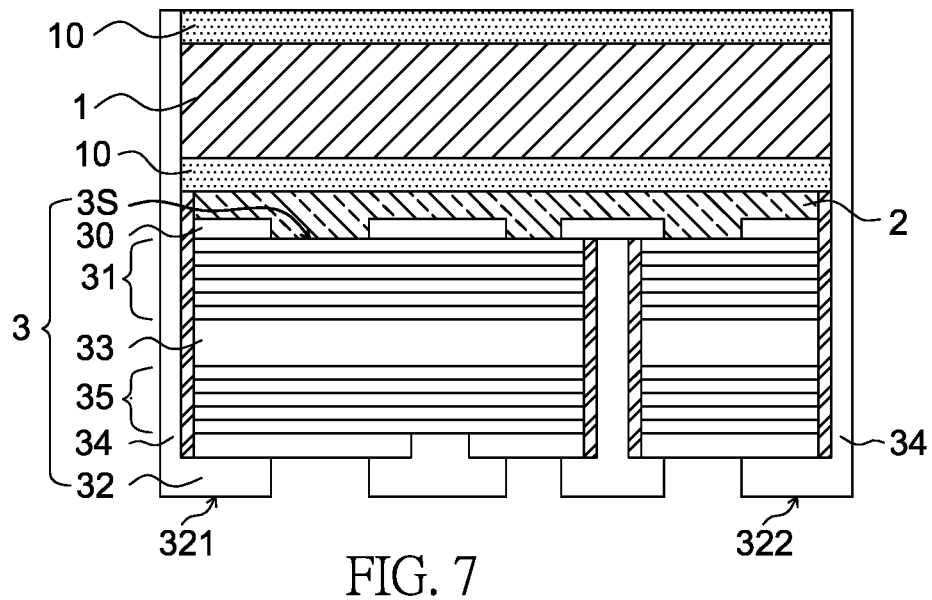
FIG. 7 is a schematic view of the laser element according to an embodiment of the present application.

Referring to FIG. 7, in an embodiment, the laser element is structurally different from the abovementioned embodiments in that the plurality of conductive layers 10 is simultaneously disposed on two opposite sides of the transparent substrate 1, and the first channels 34 penetrate through the adhesive layer 2, the transparent substrate 1 and at least one conductive layer 10, or simultaneously penetrates through the conductive layers 10 on two sides of the transparent substrate 1. Therefore, when the conductive layer 10 on one or two sides is damaged, resistance values measured by the plurality of detecting electrodes 321, 322 are changed for ensuring that the two sides of the transparent substrate 1 (i.e., the optical element) are not damaged, and preventing the laser light not processed by the transparent substrate 1 from being leaked. The structural features and connection relationships of other components have been described as above.

Figure 8:
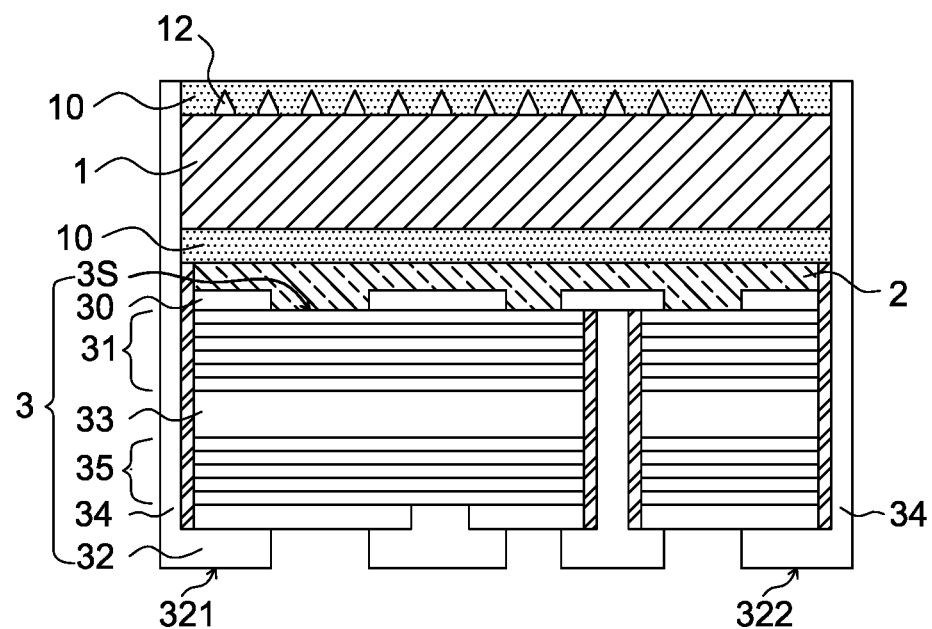
FIG. 8 is a schematic view of the laser element according to an embodiment of the present application.

Referring to FIG. 8, in an embodiment, the laser element further includes an optical structure 12 disposed on one side of the transparent substrate 1 opposite to the adhesive layer 2, that is. For example, the optical structure 12 is a diffractive optical element and is able to match with the laser unit 3 to generate tens of thousands of laser spots which are suitable for three-dimensional sensing or face recognition.

Figure 9:
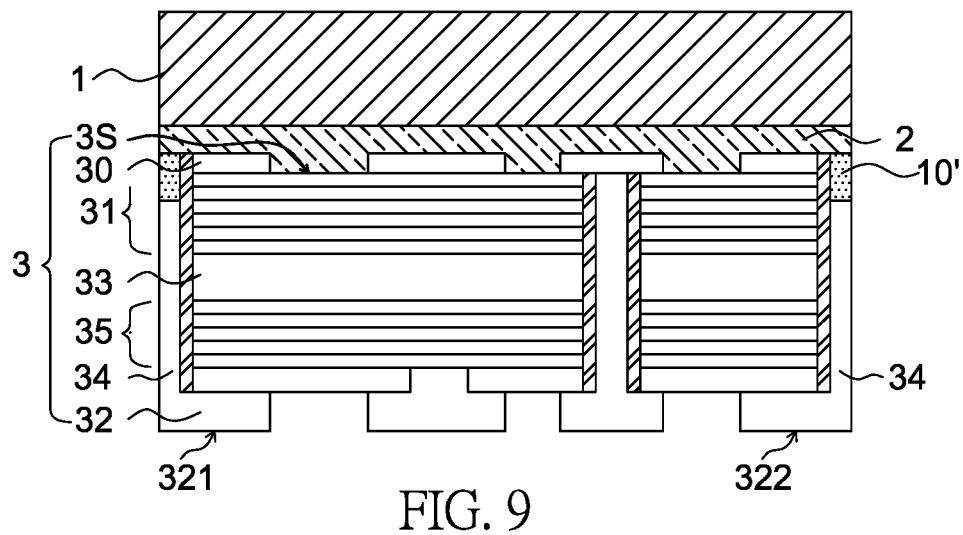
FIG. 9 is a schematic view of the laser element according to an embodiment of the present application.

Referring to FIG. 9, the laser element according to another embodiment of the present application includes a transparent substrate 1, an adhesive layer 2, a conductive region 10', a laser unit 3, and a plurality of first channels 34. The conductive region 10' includes a transparent conductive oxide, a metal, or silicon monoxide. The transparent conductive oxide may be indium tin oxide (ITO) or indium zinc oxide (IZO). The laser unit 3 includes a front conductive structure 30, a first type semiconductor stack 31, an active layer 33, a second type semiconductor stack 35, an insulating layer 36, and a back conductive structure 32. The component features, connection relationships and advantages of the transparent substrate 1, the front conductive structure 30, the first type semiconductor stack 31, the active layer 33, the first channels 34, the passivation layer 340, the second type semiconductor stack 35, the insulating layer 36 and the back conductive structure 32 of the laser element, and the related embodiments thereof have been described as above. The present embodiment is different from the above-mentioned embodiments in that an annular conductive region 10' is used for replacing the entire conductive layer to simplify the semiconductor manufacturing process and increase the production yield, and namely, the conductive region 10' is disposed on the periphery of the adhesive layer 2. The conductive region 10' surrounds the laser unit 3 and is electrically separated therefrom to prevent the conductive region 10' from contacting the laser unit 3 to form a short circuit or interfere with the monitoring circuit. In the present embodiment, since the first channels 34 do not penetrate through the adhesive layer 2 and the transparent substrate 1, it is easier to control the etching process for forming the first channels 34. Further, the conductive region 10' is formed after the etching process for forming the first channels 34, thereby preventing the conductive material for forming the conductive region 10' from being affected in the etching process.

Figure 10:
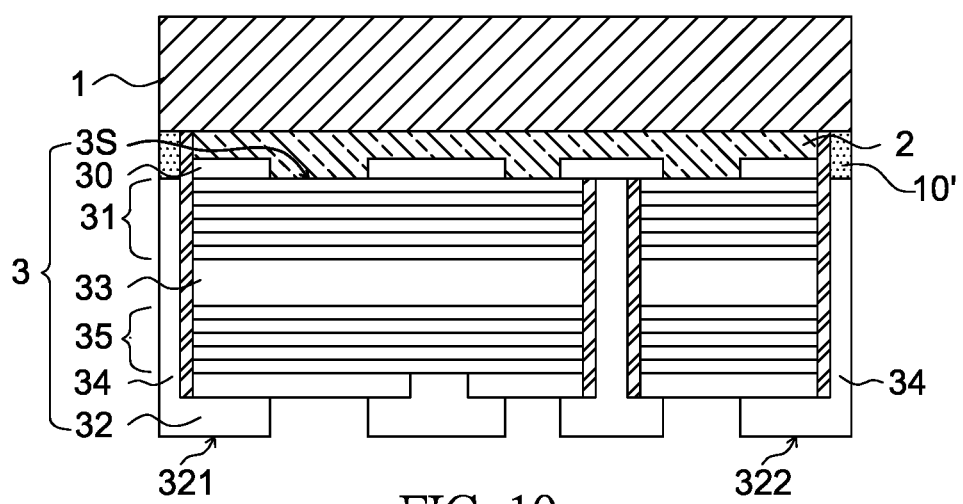
FIG. 10 is a schematic view of the laser element according to an embodiment of the present application.

Referring to FIG. 10, in an embodiment, the laser element is structurally different from the embodiment shown in FIG. 9 in that the conductive region 10' penetrate through the adhesive layer 2, and two sides of the conductive region 10' are respectively connected to the transparent substrate 1 and the first channels 34. The rest of the component features can be referred to the above description for detailed descriptions. In the present embodiment, since the conductive region 10' is directly connected to the transparent substrate 1, abnormal conditions of the transparent substrate 1 can be acutely monitored. Further, the conductive region 10' is formed after the etching process for forming the first channels 34, thereby preventing the conductive material for forming the conductive region 10' from being affected in the etching process.

Figure 11:
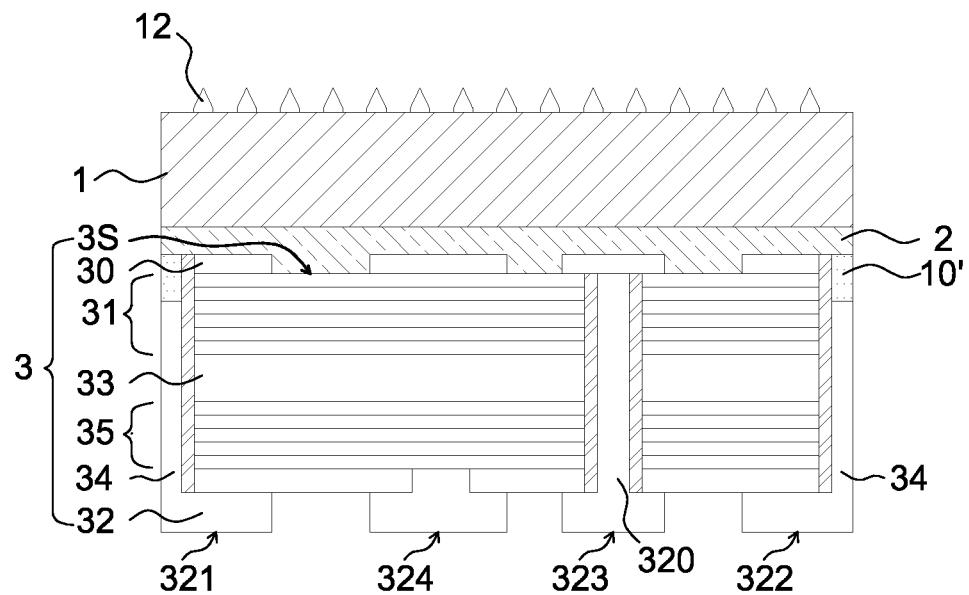
FIG. 11 is a schematic view of the laser element according to an embodiment of the present application.

Referring to FIG. 11, in an embodiment, the laser element includes an optical structure 12 disposed on one side of the transparent substrate 1 opposite to the adhesive layer 2. For example, the optical structure 12 is an optical element such as a diffractive optical element, a microlens or the like, and is able to match with the laser unit 3 to generate tens of thousands of laser spots. The related advantages have been described as above.

Figure 12:
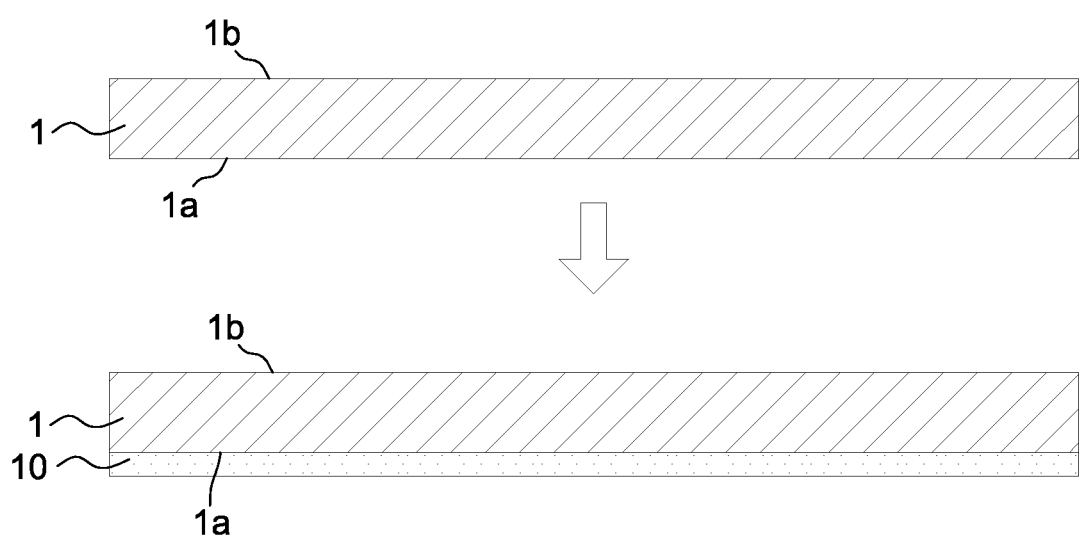
FIG. 12 to FIG. 16 are schematic views showing the steps of manufacturing a laser element according to an embodiment of the present application.

Referring to FIG. 12 to FIG. 16, a manufacturing method of a laser element according to still another embodiment of the present application is described below. Firstly, a conductive layer 10 is formed on a transparent substrate 1. As shown in FIG. 12, the transparent substrate 1 includes a first surface 1a and a second surface 1b opposite to each other, the conductive layer 10 is disposed on the first surface 1a, and the transparent substrate 1 faces a laser unit 3 with the first surface 1a. The material composition, structural features, the connection relationship between the components of the conductive layer 10 and the transparent substrate 1, and the related embodiments thereof have been described as above.

Figure 13:
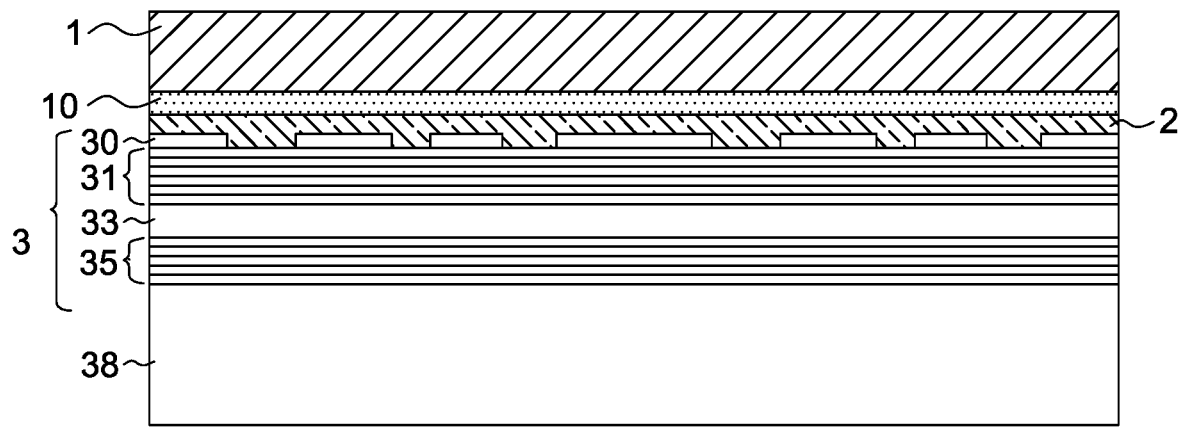

The transparent substrate 1 and a laser unit 3 are bonded by an adhesive layer 2, as shown in FIG. 13. In an embodiment, the laser unit 3 includes a front conductive structure 30, a first type semiconductor stack 31, an active layer 33, and a second type semiconductor stack 35 sequentially stacked on a substrate 38. In another embodiment, the substrate 38 is a wafer substrate to grow the plurality of laser units 3. Therefore, in the present embodiment, the following monitoring circuit growth steps and subsequent miniaturized packaging application may be performed on a wafer level.

Figure 14:
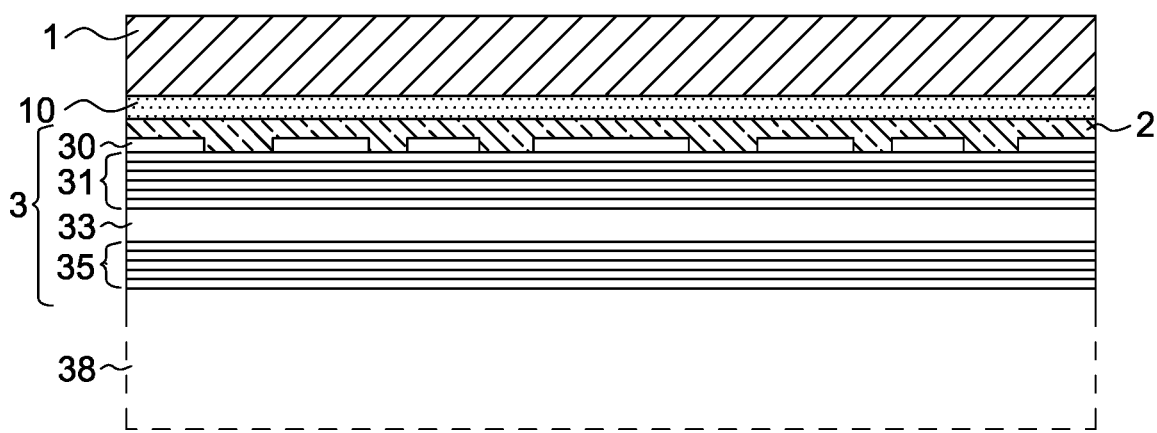
Figure 15:
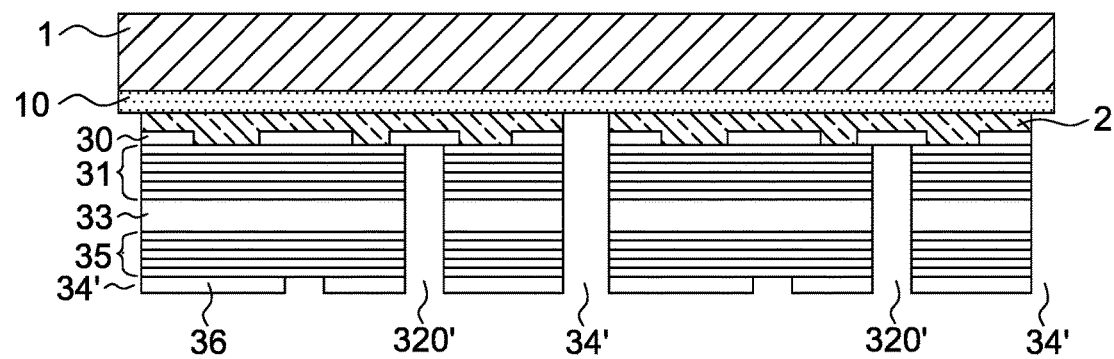

The substrate 38 of the laser unit 3 is removed, as shown in FIG. 14, to expose the second type semiconductor stack 35, which can facilitate the subsequent step of forming a back conductive structure. As shown in FIG. 15, through an etching process, a plurality of first via holes 34' penetrating through the laser unit 3 and the adhesive layer 2 is formed to expose a portion of the conductive layer 10 and a plurality of second via holes 320' is formed to expose a portion of the front conductive structure 30. Then, a patterned insulating layer 36 is formed on the second type semiconductor stack 35.

Figure 16:
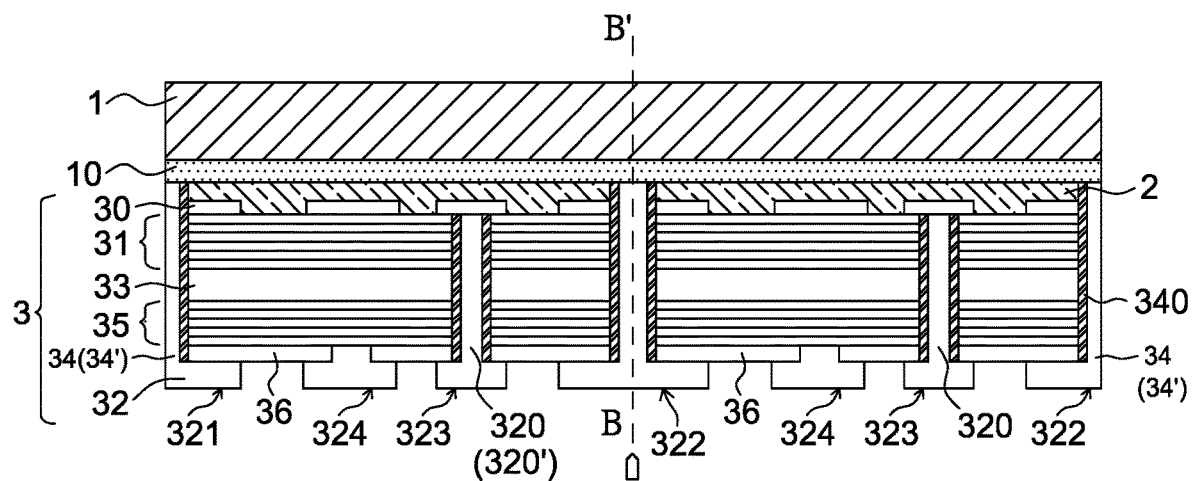

Next, referring to FIG. 16, a passivation layer 340 is formed on an inner wall of each of the first via holes 34' and the second via holes 320'. The functions and effects of the passivation layer 340 have been described as above. Through an evaporation process, the plurality of the first via holes 34' is filled with a conductive material and connected to the conductive layer 10 to form the plurality of first channels 34. Then, a back conductive structure 32 is formed on the surface of the insulating layer 36 of the laser unit 3. The back conductive structure 32 includes a plurality of detecting electrodes 321, 322 separated from each other, and the plurality of detecting electrodes 321, 322 is respectively connected to the first channel 34.

In an embodiment, the laser unit 3 is a flip chip structure. Therefore, in the step of forming the back conductive structure 32, a plurality of first and second conductive electrodes 323, 324, which is separated from and coplanar with the plurality of detecting electrodes 321, 322, is formed at the same time. Further, as shown in FIG. 15, in the etching process, a plurality of second via holes 320' and the plurality of first via holes 34' are formed at the same time, and then, the plurality of second via holes 320' is filled with the passivation layer 340 and the conductive material during the evaporation process to form the plurality of second channels 320, so that two ends of each of the second channels 320 are respectively connected to the front conductive structure 30 and the first conductive electrode 323 of the back conductive structure 32. The structural features, connection relationships and advantages of the components, and the related embodiments thereof have been described as above. Finally, a cutting process is performed along the dot-line BB' to separate the laser unit 3 and the transparent substrate 1 to form multiple laser elements, wherein the structure of each of the multiple laser elements is shown in FIG. 1.

In an embodiment, the manufacturing method of the laser device further includes forming an optical structure on one side of the transparent substrate opposite to the adhesive layer. For example, the optical structure may be formed by a lithography process or a bonding process. The component features of the optical structure and the related embodiments thereof have been described as above.

Referring to FIG. 12, the conductive layer 10 is formed on the first surface 1a of the transparent substrate 1, and in other embodiment, as shown in FIG. 6, the second surface 1b of the transparent substrate 1 can be bonded to the laser unit 3 with the adhesive layer 2, that is, the conductive layer 10 and the adhesive layer 2 are respectively disposed on two opposite sides of the transparent substrate 1. In the present embodiment, through the etching process, the first via holes 34' further penetrates through the transparent substrate 1, and then is filled with the passivation layer 340 and the conductive medium which is used as the first channels 34 during the evaporation process, so that the two ends of each of the first channels 34 are respectively connected to the front conductive structure 30 and the plurality of detecting electrodes 321, 322 of the back conductive structure 32, as shown in FIG. 6.

Figure 17:
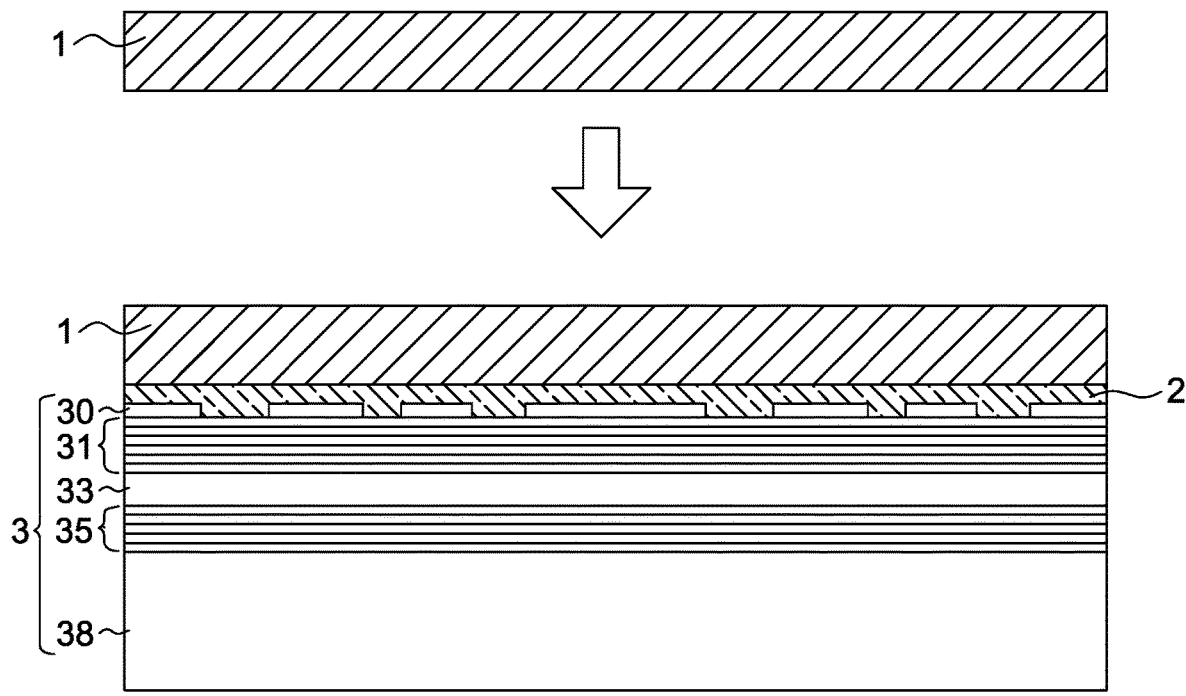
FIG. 17 to FIG. 21 are schematic views showing the steps of manufacturing a laser element according to an embodiment of the present application.

Referring to FIG. 17 to FIG. 21, a manufacturing method of a laser element according to another embodiment of the present invention is described below. Firstly, a transparent substrate 1 and a laser unit 3 are bonded through an adhesive layer 2, as shown in FIG. 17. In an embodiment, the laser unit 3 includes a front conductive structure 30, a first type semiconductor stack 31, an active layer 33, and a second type semiconductor stack 35 sequentially stacked on a substrate 38. The structural features, material composition and advantages of the components, and the related embodiments thereof have been described as above.

Figure 18:
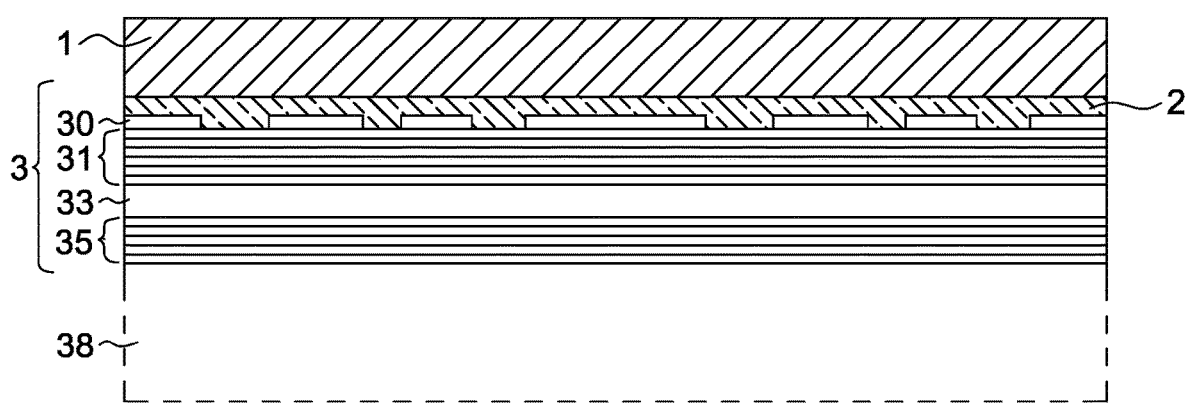
Figure 19:
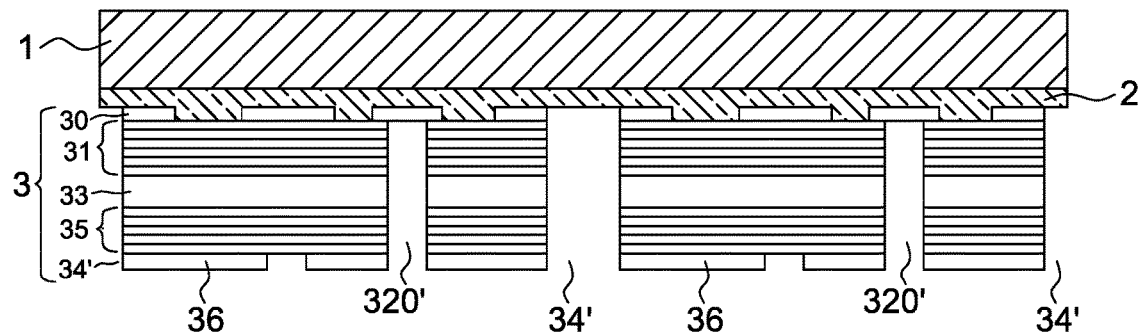

As shown in FIG. 18, the substrate 38 of the laser unit 3 is removed to expose the second type semiconductor stack 35, which can facilitate the subsequent step of forming a back conductive structure. As shown in FIG. 19, through an etching process, a plurality of first via holes 34' penetrating through the laser unit 3 is formed to expose a portion of the adhesive layer 2 and a plurality of second via holes 320' is formed to expose a portion of the front conductive structure 30. Then, a patterned insulating layer 36 is formed on the second type semiconductor stack 35.

Figure 20:
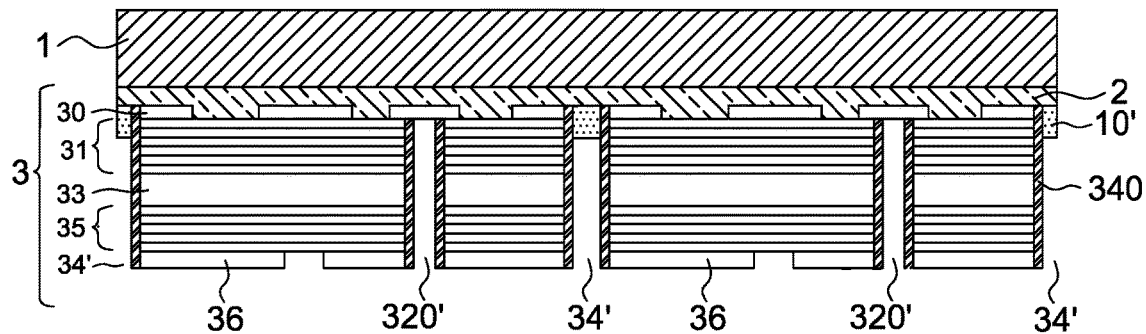
Figure 21:
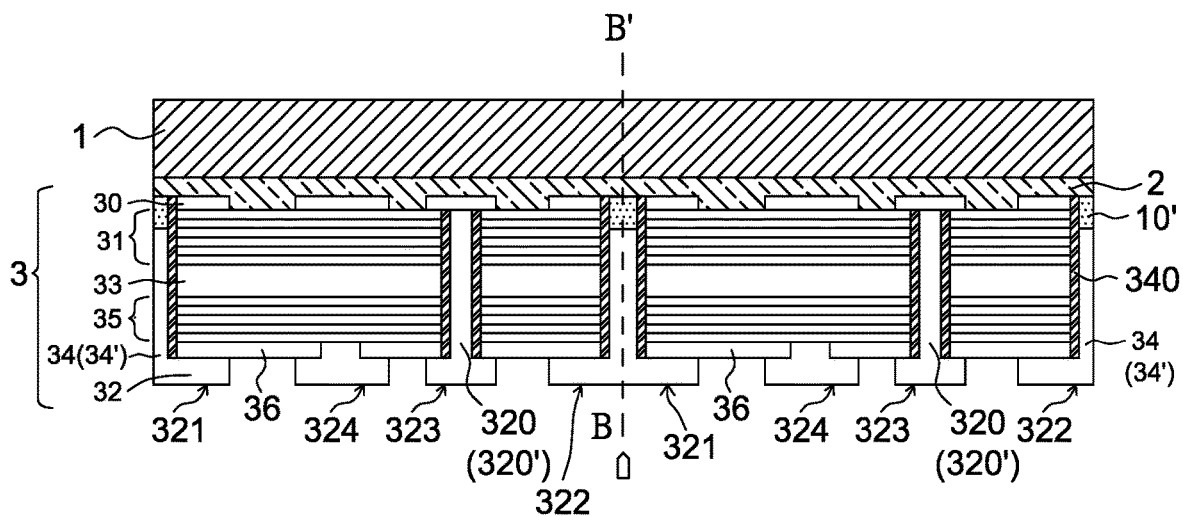

Next, referring to FIG. 20, a passivation layer 340 is formed on an inner wall of each of the plurality of first via holes 34' and the second via holes 320'. The functions and effects of the passivation layer 340 have been described as above. Then, a conductive region 10' is formed in the plurality of first via holes 34' and on the passivation layer 340. The conductive region 10' surrounds the periphery of the laser unit 3 and connects the adhesive layer 2. The conductive region 10' is electrically separated from the laser unit 3 by the passivation layer 340 to prevent the conductive region 10' from being electrically interfered by the laser unit 3 or from forming short circuit therewith. As shown in FIG. 21, through an evaporation process, the plurality of first via holes 34' is filled with a conductive medium which is used as the first channels 34 and is connected to the conductive region 10'. Then, a back conductive structure 32 is formed on the surface of the insulating layer 36 of the laser unit 3. The back conductive structure 32 includes a plurality of detecting electrodes 321, 322 separated from each other, and the detecting electrodes 321, 322 are respectively connected to the plurality of first channels 34.

In an embodiment, the laser unit 3 is a flip chip structure. Therefore, in the step of forming the back conductive structure 32, a plurality of conductive electrodes 323, 324, which is separated from and coplanar with the plurality of detecting electrodes 321, 322, is formed at the same time. Further, as shown in FIG. 19, in the etching process, a plurality of second via holes 320' and the plurality of first via holes 34' are formed at the same time. And, as shown in 21, a passivation layer 340 is formed on an inner wall of each of the plurality of second via holes 320', and then, the plurality of second via holes 320' is filled with the conductive material to form a plurality of second channels 320 through the evaporation process, so that the two ends of each of the second channels 320 are respectively connected to the front conductive structure 30 and the first conductive electrode 323 of the back conductive structure 32. The structural features, connection relationships and advantages of the components, and the related embodiments thereof have been described as above. Finally, a cutting process is performed along the dot-line BB' to separate the laser unit 3 and the transparent substrate 1 to form multiple laser elements, wherein the structure of each of the multiple laser elements is shown in FIG. 11.

Referring to FIG. 21, in an embodiment, the manufacturing method of the laser device further includes forming an optical structure (not shown) on one side of the transparent substrate 1 opposite to the adhesive layer 2. For example, the optical structure may be formed by a lithography process or a bonding process. The component features of the optical structure and the related embodiments thereof have been described as above.

Figure 22:
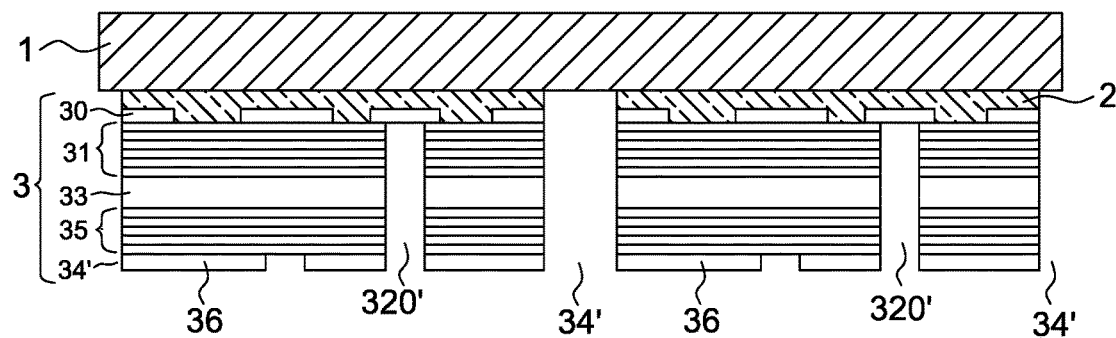
FIG. 22 to FIG. 24 are schematic views showing the steps of manufacturing a laser element according to an embodiment of the present invention.
Figure 24:
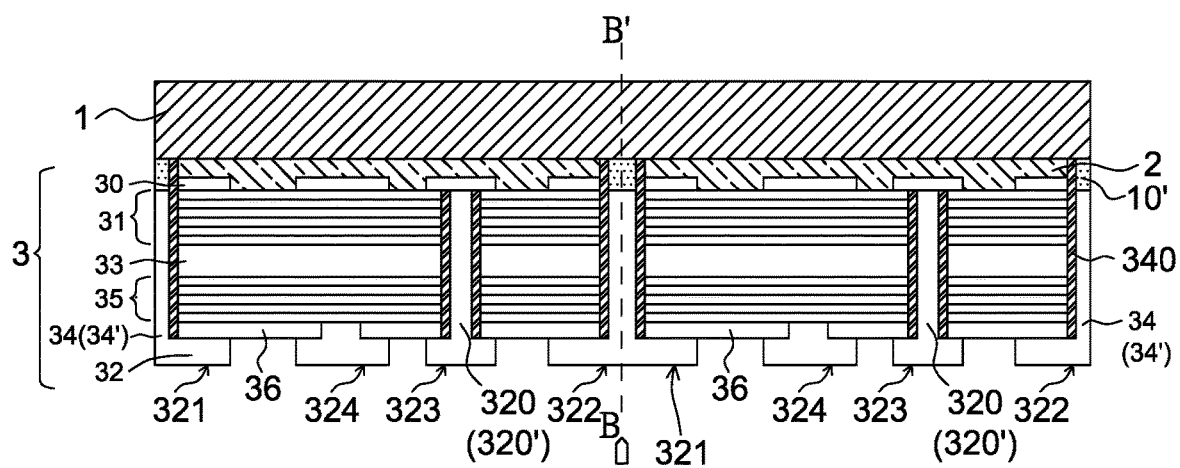

Referring to FIG. 22 and FIG. 24, in some embodiments, through the etching process, the plurality of first via holes 34' penetrating through the laser unit 3 and the adhesive layer 2 is formed to expose a portion of the transparent substrate 1, and a plurality of second via holes 320' is formed to expose a portion of the front conductive structure 30, as shown in FIG. 22.

Figure 23:
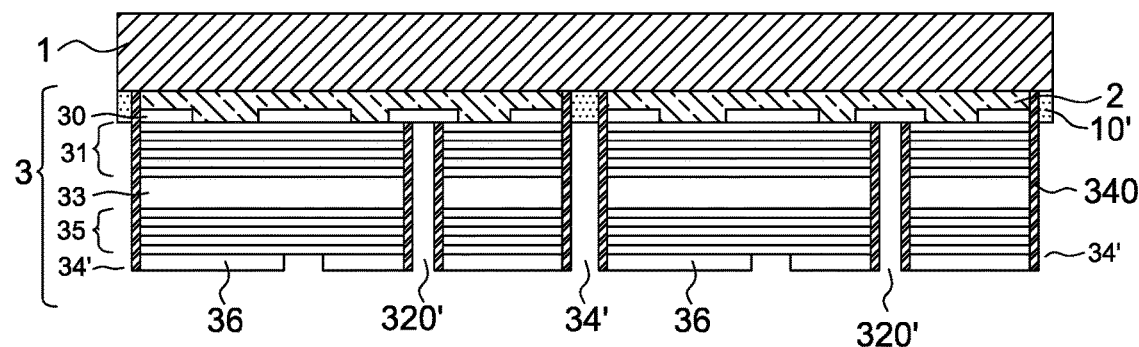

Referring to FIG. 23, a passivation layer 340 is formed on an inner wall of each of the first via holes 34' and the second via holes 320'. The functions and effects of the passivation layer 340 have been described as above. Then, a conductive region 10' is formed in each of the first via holes 34' and on the passivation layer 340. The conductive region 10' surrounds the periphery of the laser unit 3 and is directly disposed on the transparent substrate 1, thereby monitoring abnormal conditions such as damage of the transparent substrate 1 more acutely. The conductive region 10' is electrically separated from the laser unit 3 by the passivation layer 340 to prevent the conductive region 10' from being electrically interfered by the laser unit 3 or from forming a short circuit therewith. As shown in FIG. 24, through an evaporation process, the plurality of first via holes 34' is filled with a conductive medium which is used as the first channels 34 and is connected to the conductive region 10'. Finally, a back conductive structure 32 is formed on the surface of the insulating layer 36 of the laser unit 3. The back conductive structure 32 includes a plurality of detecting electrodes 321, 322 separated from each other, and the detecting electrodes 321, 322 are respectively connected to the first channels 34.

In an embodiment, the laser unit 3 is a flip chip structure. Therefore, in the step of forming the back conductive structure 32, a plurality of conductive electrodes 323, 324, which are separated from and coplanar with the plurality of detecting electrodes 321, 322, is formed at the same time. Further, in the etching process, a plurality of second via holes 320' and the plurality of first via holes 34' are formed at the same time, and the plurality of second via holes 320' is filled with the passivation layer 340 and the conductive material to form a plurality of second channels 320 through the evaporation process, so that the two ends of each of the second channels 320 are respectively connected to the front conductive structure 30 and the first conductive electrode 323 of the back conductive structure 32. The structural features, connection relationships and advantages of the components, and the related embodiments thereof have been described as above. Finally, a cutting process is performed along the dot-line BB' to separate the laser unit 3 and the transparent substrate 1 to form multiple laser elements, wherein the structure of each of the multiple laser elements is as shown in FIG. 10.

In an embodiment, the manufacturing method of the laser device further includes forming an optical structure (not shown) on one side of the transparent substrate 1 opposite to the adhesive layer 2. For example, the optical structure may be formed by a lithography process or a bonding process. The component features of the optical structure and the related embodiments thereof have been described as above.

Based on the above, some embodiments of the present application provide a laser element and a manufacturing method thereof. The laser element includes the monitoring circuit composed of the conductive layer/conductive region, the first channels and the detecting electrodes, the external control circuit is connected with the monitoring circuit in the laser element, and whether to cut off the power supply to the laser unit is determined according to the change of the resistance value of the conductive layer/conductive region, so as to prevent the laser light emitted by the laser unit from being leaked via the damaged region(s) of the transparent substrate and being directly irradiated to the human eyes, thereby achieving the effect of eye safety monitoring and protection. At the same time, the manufacturing process of forming an integrally formed element can reduce the package size of the module, simplify the module packaging process and reduce the production cost. For example, through a wafer level semiconductor process, the laser element with the built-in monitoring circuit can be produced in flip chip package without a wire bonding for saving the package volume and facilitating subsequent miniaturized applications.

The embodiments described above are only for explaining the technical idea and characteristics of the present invention with the purpose of enabling those skilled in the art to understand the contents of the present application and implement them accordingly, and are not intended to limit the patent scope of the present application. That is, any equivalent change or modification made by the spirit of the present invention shall fall within the patent scope of the present application.

What is claimed is:

1. A laser element, comprising:
   a transparent substrate;
   a conductive layer on the transparent substrate;
   an adhesive layer attached to the transparent substrate and having a first side surface; and
   a laser unit comprising:
      a front conductive structure, attached to the adhesive layer and having a second side surface;
      a back conductive structure, comprising a first detecting electrode and a second detecting electrode separated from the first detecting electrode;
      a passivation layer covering one of the first side surface and the second side surface; and
      first via holes extending from the back conductive structure to the conductive layer;
   wherein the first detecting electrode and the second detecting electrode are electrically connected to the conductive layer through the first via holes,
   wherein the passivation layer directly contacts the first side surface and the second side surface.

2. The laser element according to claim 1, wherein the back conductive structure further comprises a first conductive electrode and a second conductive electrode separated from the first conductive electrode.

3. The laser element according to claim 2, wherein the first conductive electrode is coplanar with the first detecting electrode.

4. The laser element according to claim 2, wherein the laser unit further comprises a second channel connected to the front conductive structure and the first conductive electrode.

5. The laser element according to claim 2, wherein the first conductive electrode is separated from the first detecting electrode.

6. The laser element according to claim 1, wherein the passivation layer is disposed in the first via holes.

7. The laser element according to claim 1, further comprising a plurality of first channels in the first via holes, and wherein one of the first channels connects the first detecting electrode and the conductive layer.

8. The laser element according to claim 7, wherein the conductive layer is disposed on one side of the transparent substrate opposite to the adhesive layer, and the first channel covers a side surface of the transparent substrate.

9. The laser element according to claim 1, wherein the transparent substrate is surrounded by the conductive layer, the passivation layer and the adhesive layer.

10. The laser element according to claim 1, further comprising an optical structure disposed on one side of the transparent substrate opposite to the adhesive layer.

11. The laser element according to claim 1, wherein the front conductive structure is electrically separated from the first detecting electrode and the second detecting electrode.

12. The laser element according to claim 1, wherein the conductive layer surrounds the laser unit and is electrically separated therefrom.

13. The laser element according to claim 1, wherein the adhesive layer locates between the transparent substrate and the conductive layer.

14. The laser element according to claim 1, wherein the conductive layer is disposed on a periphery of the adhesive layer.

15. The laser element according to claim 1, wherein the laser unit further comprises a first type semiconductor stack, an active layer, and a second type semiconductor stack sequentially stacked on the transparent substrate.

16. The laser element according to claim 15, wherein the conductive layer surrounds the first type semiconductor stack.

17. The laser element according to claim 1, wherein the conductive layer surrounds the adhesive layer.

18. The laser element according to claim 1, wherein the first via holes penetrate through the adhesive layer, and the conductive layer is connected to the transparent substrate.

19. The laser element according to claim 1, wherein the transparent substrate comprises a third side surface, and the passivation layer covers the third side surface.

20. A laser element, comprising:
   a transparent substrate;
   a conductive layer on the transparent substrate;
   an adhesive layer attached to the transparent substrate and having a first side surface; and a laser unit comprising:
- a front conductive structure, attached to the adhesive layer and having a second side surface;
- a back conductive structure, comprising a first detecting electrode and a second detecting electrode separated from the first detecting electrode;
- a passivation layer covering one of the first side surface and the second side surface; and first via holes extending from the back conductive structure to the conductive layer;

wherein the first detecting electrode and the second detecting electrode are electrically connected to the conductive layer through the first via holes, wherein the adhesive layer locates between the transparent substrate and the conductive layer.

* * * * *